(12) United States Patent
Nam et al.

(10) Patent No.: US 7,892,880 B2
(45) Date of Patent: Feb. 22, 2011

(54) METHOD OF MANUFACTURING A PHOTO-DETECTOR ARRAY DEVICE WITH ROIC MONOLITHICALLY INTEGRATED FOR LASER-RADAR IMAGE SIGNAL

(75) Inventors: Eun Soo Nam, Deajeon (KR); Myoung Sook Oh, Daejeon (KR); Ho Young Kim, Daejeon (KR); Young Jun Chong, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/724,667

(22) Filed: Mar. 16, 2010

(65) Prior Publication Data

US 2010/0173443 A1 Jul. 8, 2010

Related U.S. Application Data

(62) Division of application No. 12/143,584, filed on Jun. 20, 2008, now Pat. No. 7,759,703.

(30) Foreign Application Priority Data

Dec. 10, 2007 (KR) .................. 10-2007-0127879

(51) Int. Cl.
*H01L 21/00* (2006.01)
(52) U.S. Cl. ............ 438/94; 257/E31.097; 257/E31.069
(58) Field of Classification Search .................. 438/94; 257/E31.097
See application file for complete search history.

(56) References Cited

U.S. PATENT DOCUMENTS 5,689,122 A * 11/1997 Chandrasekhar ............ 257/184
6,727,530 B1 * 4/2004 Feng et al. .................. 257/184

FOREIGN PATENT DOCUMENTS

| KR | 1993-0017199 | 8/1993 |
|----|--------------|--------|
| KR | 10-0171649 | 10/1998 |
| KR | 1999-021365 | 3/1999 |
| KR | 1999-0038944 | 6/1999 |

OTHER PUBLICATIONS

Effendberger et al., Ultrafast InGaAs pin detector for eyesafe LIDAR, Part of the SPIE Conference on Laser Radar Technology and Applications III, vol. 3380, Apr. 1998, p. 144-150.
Kong et al., Electrical Isolation of MQW InGaAsP/InP Structures by MeV Iron Ion Implantation for Vertical Pin Modulators and Photodiodes, International Conference on Indium Phoshide and Related Conference Proceedings, Jun. 2004, p. 362-365.

* cited by examiner

*Primary Examiner*—W. David Coleman
*Assistant Examiner*—Christine Enad
(74) *Attorney, Agent, or Firm*—Rabin & Berdo, P.C.

(57) ABSTRACT

A method of manufacturing a photo-detector array device integrated with a read-out integrated circuit (ROIC) monolithically integrated for a laser-radar image signal. A detector array device, a photodiode and control devices for selecting and outputting a laser-radar image signal are simultaneously formed on an InP substrate. In addition, after the photodiode and the control devices are simultaneously formed on the InP substrate, the photodiode and the control devices are electrically separated from each other using a polyamide, whereby a PN junction surface of the photodiode is buried to reduce surface leakage current and improve electrical reliability, and the structure of the control devices can be simplified to improve image signal reception characteristics.

4 Claims, 10 Drawing Sheets

METHOD OF MANUFACTURING A PHOTO-DETECTOR ARRAY DEVICE WITH ROIC MONOLITHICALLY INTEGRATED FOR LASER-RADAR IMAGE SIGNAL

CROSS-REFERENCE TO RELATED APPLICATIONS

This is a divisional application of U.S. application Ser. No. 12/143,584, filed Jun. 20, 2008 now U.S. Pat. No. 7,759,703, the disclosure of which is incorporated herein by reference. This application claims the priority of Korean Patent Application No. 10-2007-127879 filed on Dec. 10, 2007, in the Korean Intellectual Property Office, the disclosure of which is incorporated herein by reference.

BACKGROUND OF THE INVENTION

1. Field of the Invention

The present invention relates to a photo-detector array device, and more particularly, to a photo-detector array device with a read-out integrated circuit (ROIC) monolithically integrated for a laser-radar image signal capable of simplifying manufacturing processes and greatly increasing yield, and a manufacturing method thereof.

This work was supported by the IT R&D program of MIC/IITA [2005-S-110-03, InGaAs Photo-detection Receiver Embedded with Three-Dimensional Distance/Image Signal Processing Integration Circuit].

2. Description of the Related Art

In a photo-detector array IC for detecting a laser-radar image signal in an eye-safe 1.55 µm IR band, photo-detection devices are arrayed to be electrically separated from each other. Two-dimensional electrical signals of the photo-detection devices are independently read out as optical-current signals, and after that, digital signal processing is performed on the optical-current signals so as to reproduce the image signal.

FIG. 1 is a circuit diagram illustrating a conventional photo-detector array IC_ (Integrated Circuit) for a laser-radar image signal.

Referring to FIG. 1, a conventional photo-detector array IC includes n×m photo-detection pixels 110 which are arrayed in a matrix to generate electric signals having values corresponding to an amount of incident light and a ROIC 120 disposed to one side of the array of n×m photo-detection pixels 110 to select outputs of the n×m electric signals. Each of the photo-detection pixels 110 includes a photodiode PD. The ROIC 120 includes m first NMOSFET NM1 and n second NMOSFETs NM2.

Each photodiode PD generates a current (or voltage) corresponding to an amount of the incident light.

Each first NMOSFET NM1 selects electric signals corresponding to the currents generated by the photodiodes PD in the row of the photo-detector array.

And, each second NMOSFET NM2 controls outputs of the electric signals applied to the second NMOSFETs NM2 in response to the output control signals selected by o-ctrl1 to o-ctrln.

In the conventional photo-detector array device IC, the photo-detection devices are implemented with InGaAs/InP-based photodiodes PD capable of detecting 1.55 µm light. The control devices for selecting the light detection and output of the photodiodes PD are implemented with NMOSFETs NM1 and NM2.

However, the NMOSFETs NM1 and NM2 are manufactured by using a silicon CMOS-based manufacturing process which is different from that of the InGaAs/InP-based photodiodes PD.

Therefore, in the conventional photo-detector array device IC, the photodiode array is manufactured in a flip chip form, and the NMOSFETs NM1 and NM2 are manufactured as silicon CMOS-based circuits. Next, these devices are packaged and integrated into one device.

However, the photodiode array and the NMOSFET-based ROIC are separately manufactured through different manufacturing processes, and after that, the photodiode array and the ROIC are packaged in one device. Therefore, a very complicated, difficult hybrid integration align process is needed so as to spatially align electrode structures of the photodiode and the NMOSFETs. As a result, the manufacturing processes for the photo-detector array IC become complicated and difficult. In addition, yield thereof becomes very low.

Furthermore, since a surface of PN junction of the photodiode is directly exposed, surface leakage current occurs with a high probability. Therefore, it is very difficult to implement ultra large scale integration of the photo-detector array device IC.

SUMMARY OF THE INVENTION

The present invention provides a photo-detector array device with ROIC monolithically integrated for a laser-radar image signal capable of simplifying manufacturing processes and greatly increasing yield and a manufacturing method thereof.

The present invention also provides a photo-detector array device with ROIC monolithically integrated for a laser-radar image signal capable of implementing ultra large scale integration by increasing a degree of integration and an operating speed of a photo-detection pixel and improving noise characteristics thereof.

According to an aspect of the present invention, there is provided photo-detector array IC for a laser-radar image signal, comprising: a plurality of photo-detection pixels, each including a photodiode for converting an incident light energy to an electric energy and a ROIC (read-out integrated circuit) including a first heterojection bipolar transistor for selecting electric energy of the photodiode in the row of the photodiode array and a second heterojection bipolar transistor for selecting the output of the electrical signals that are transmitted from the photo-detector in the column of the photodiode array; and metal interconnection lines being provided for electrical connection between an n-type electrode of the photodiode and an emitter electrode of the first heterojection bipolar transistor and between a collector electrode of the first heterojection bipolar transistor and an emitter electrode of the second heterojection bipolar transistor, wherein the photodiode, the first heterojection bipolar transistor, and the second heterojection bipolar transistor are integrated as a monolithic chip on an semi-insulating InP substrate wafer.

In the above aspect of the present invention, each of the first and second heterojection bipolar transistors comprises: a buffer layer formed on the semi-insulating InP substrate wafer; a sub-collector formed on the buffer layer; a collector formed on a central region of the sub-collector; a base formed on the collector; an emitter formed on a central region of the base; an ohmic layer formed on the emitter; an emitter electrode formed on the ohmic layer; a base electrode formed on both edge regions of the base; and a collector electrode formed on both edge regions of the sub-collector; a polyimide applied on the sub-collector, the base, the emitter electrode, the base electrode, and the collector electrode; and surface pads formed on the polyimide to be electrically connected to the emitter electrode, the base electrode, and the collector electrode.

In addition, the emitter electrode, the base electrode, and the collector electrode are made of Ti/Pt/Au, respectively.

In addition, the buffer layer is made of n+-InP, the sub-collector is made of n+-InGaAs, the collector is made of i-InGaAs, the base is made of p+-InGaAs, the emitter is made of n+-InP, and the ohmic layer is made of n+-InGaAs.

In addition, the emitter, base, and collector electrodes are electrically connected to the surface pads through vias that are formed to penetrate the polyimide.

In the above aspect of the present invention, the photodiode comprises: a buffer layer formed on the semi-insulating InP substrate wafer; an n-type layer formed on the buffer layer; a photo-absorption layer formed on a central region of the n-type layer; a p-type layer formed on the photo-absorption layer; a p-type electrode formed on an edge region of the p-type layer; n-type electrodes formed on both edge regions of the n-type layer; a polyimide applied on the n-type layer, the p-type layer, the p-type electrode, the n-type electrodes; and surface pads formed on the polyimide to be electrically connected to the p-type electrode and the n-type electrode.

In addition, the p-type electrode and the n-type electrode are made of Ti/Pt/Au.

In addition, the buffer layer is made of n+-InP, the n-type layer is made of n+-InGaAs, the photo-absorption layer is made of i-InGaAs, and the p-type layer is made of p+-InGaAs.

In addition, the p-type electrode and the n-type electrode are electrically connected to the surface pads through vias that are formed to penetrate the polyimide.

According to another aspect of the present invention, there is provided a method of manufacturing a photo-detector array device with ROIC monolithically integrated for a laser-radar image signal, comprising: forming on an semi-insulating InP substrate wafer a photodiode for converting an incident light energy to an electric energy, a first heterojection bipolar transistor for selectively selecting the electric energy of the photodiode in the row of the photo-detector array and a second heterojection bipolar transistor for selecting output of the electrical signals of the photodiodes in the column of the photo-diode array, applying polyimide on the semi-insulating InP substrate wafer to be covered the photodiode and the first and the second heterojection bipolar transistors; forming surface pads on the polyimide, the surface pads being electrically connected to electrodes of the photodiode and the first and second heterojection bipolar transistors; and forming metal interconnection lines on the polyimide, the metal interconnection lines being provided for electrical connection between the surface pad of an n-type electrode of the photodiode and the surface pad of an emitter electrode of the first heterojection bipolar transistor and between the surface pad of a collector electrode of the first heterojection bipolar transistor and the surface pad of an emitter electrode of the second heterojection bipolar transistor.

In the above aspect of the present invention, the forming of the photodiode, the first heterojection bipolar transistor, and the second heterojection bipolar transistor comprises: sequentially growing n+-InP, n+-InGaAs, i-InGaAs, p+-InGaAs, n+-InP, n+-InGaAs crystal structures on the semi-insulating InP substrate wafer; forming the emitter electrodes of the first and second heterojection bipolar transistors on the n+-InGaAs; forming emitters and ohmic layers of the first and second heterojection bipolar transistors by partially etching; forming, on the p+-InGaAs, base electrodes of the first and second heterojection bipolar transistors to be separated by a predetermined distance from the emitters and forming a p-type electrode of the photodiode; forming base layers and collector layers of the first and second heterojection bipolar transistors and a photo-absorption layer and a P-type layer of the photodiode by partially etching the i-InGaAs and the p+-InGaAs; making, on the n+-InGaAs, collector electrode pads for the first and second heterojection bipolar transistors to be separated by a predetermined distance from the base layers and forming an n-type electrode of the photodiode to be separated by a predetermined distance from the photo-absorption layer; and forming buffer layers and sub-collectors of the first and second heterojection bipolar transistors and buffer layer and n-type layer of the photodiode by partially etching the n+-InP and the n+-InGaAs.

In addition, the forming of the surface pads comprises: forming vias penetrating the polyimide applied on all the electrodes so as to form the surface pads for the first and second heterojection bipolar transistors and the photodiode; forming a surface-incident-type photodiode by etching and removing the polyimide applied to a light incident region of the photodiode; and forming the surface pads on the vias to be electrically connected to all the electrodes of the first and second heterojection bipolar transistors and the photodiode.

In addition, all the electrodes of the first and second heterojection bipolar transistors and the photodiode are made of Ti/Pt/Au.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENT

Figure 1:
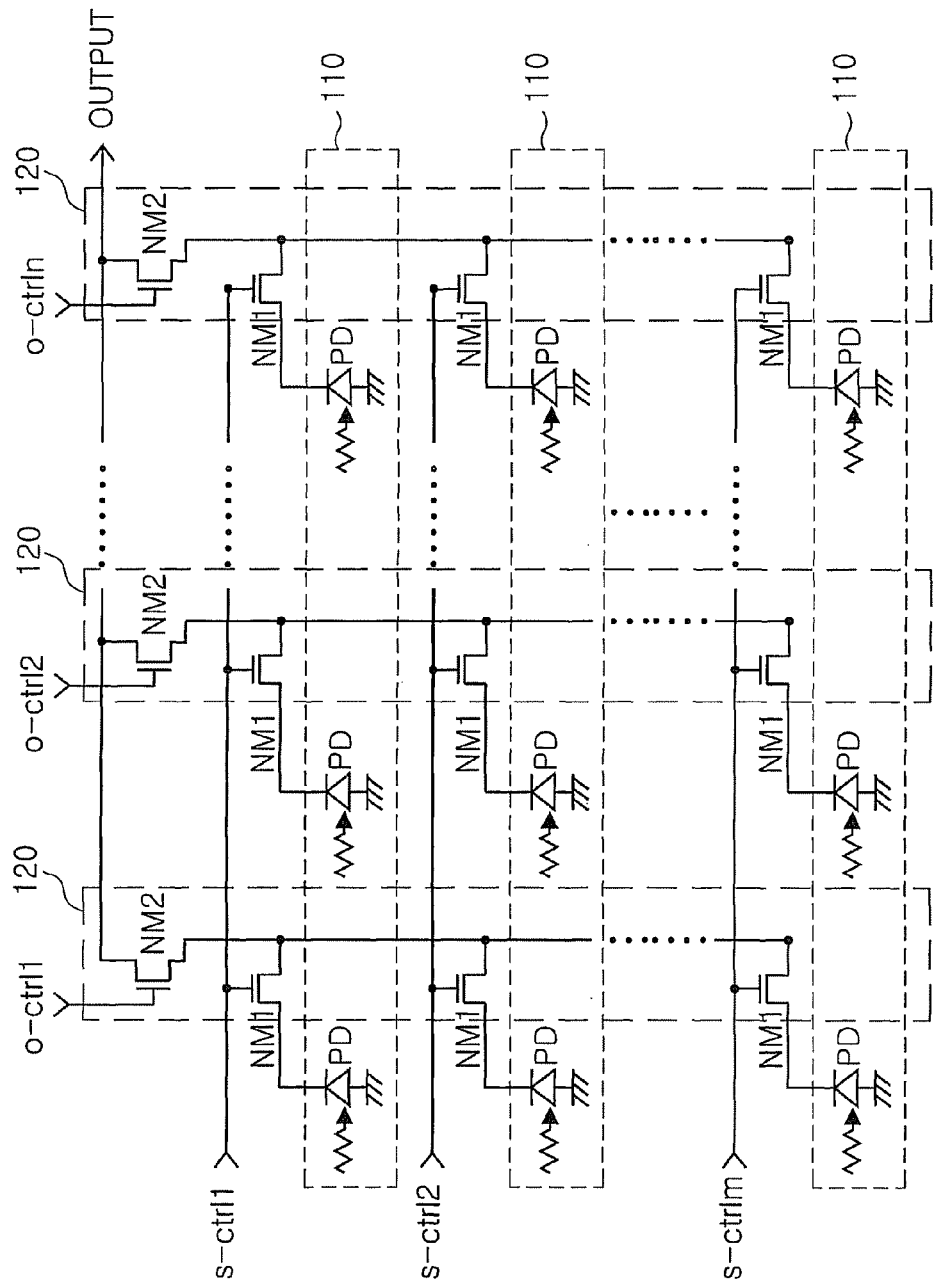
FIG. 1 is a circuit diagram illustrating a conventional photo-detector array device IC.

Hereinafter, embodiments of the present invention will be described in detail with reference to the accompanying drawings so that the ordinarily skilled in the art can easily implement the embodiments. However, in the detailed description of operational principles of the embodiments of the present invention, detailed description of well-known construction and operations will be omitted for clarifying the present invention.

In addition, in the drawings, elements having similar functions and operations are denoted by the same reference numerals.

Figure 2:
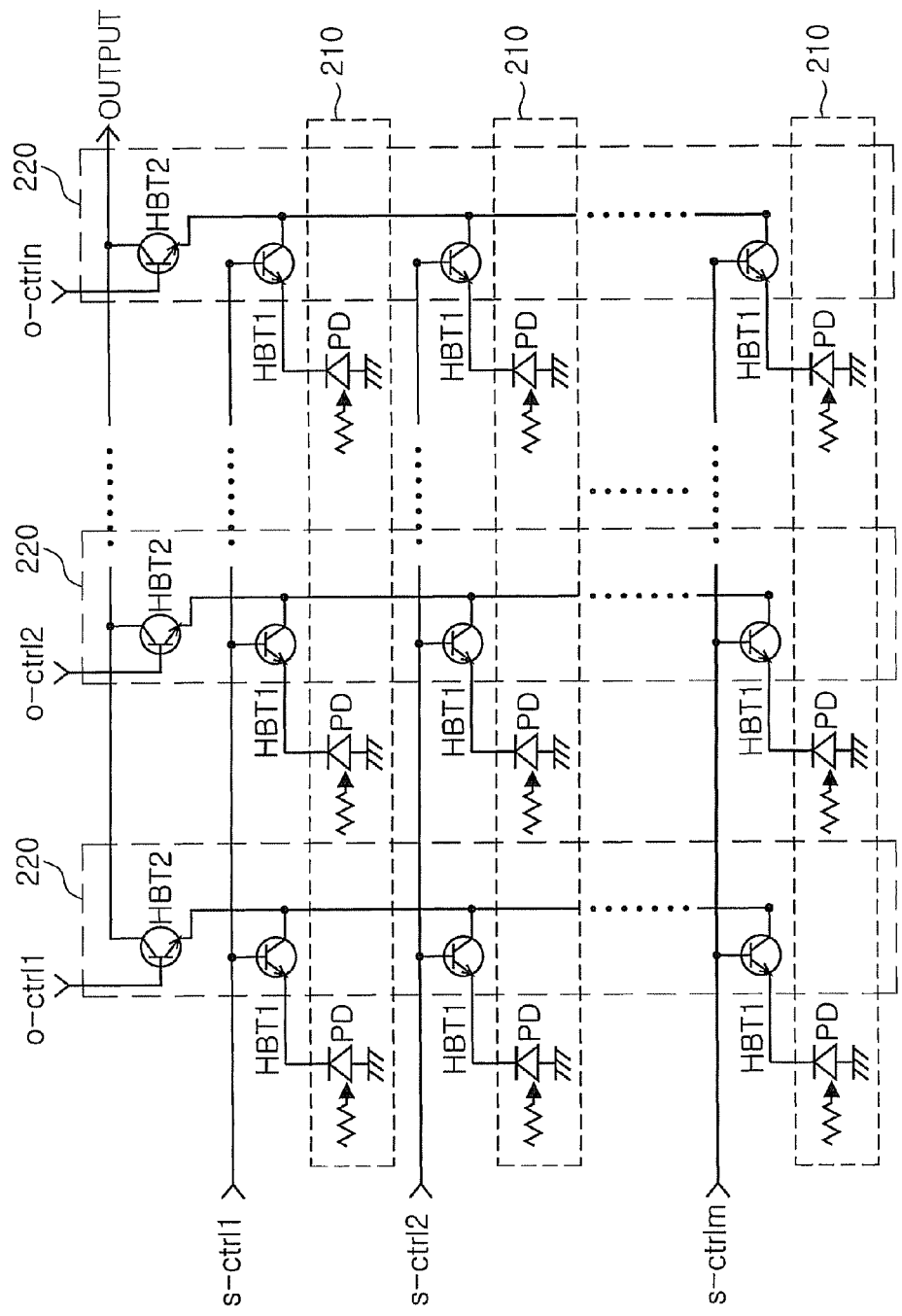
FIG. 2 is a circuit diagram illustrating a photo-detector array IC according to an embodiment of the present invention.

FIG. 2 is a circuit diagram illustrating a photo-detector array IC according to an embodiment of the present invention.

Referring to FIG. 2, the photo-detector array IC includes n×m photo-detection pixels 210 which are arrayed in a matrix similarly to a conventional structure and a ROIC 220 disposed to one side of the array of n×m photo-detection pixels 210. But, each photo-detection pixel 210 includes a photodiode PD and the ROIC 220 includes m first heterojection bipolar transistor (hereinafter, refereed to as HBT), HBT1, and n second HBT HBT2.

That is, similarly to a conventional photo-detector array device IC, the photo-detector array IC according to the present invention includes the n×m photo-detection pixels 210 and the ROIC 220. However, in the photo-detector array IC according to the present invention, conventional MOSFETs are replaced with InGaAs/InP-based HBTs which are manufactured by using a manufacturing process for a photodiode PD.

Figure 3:
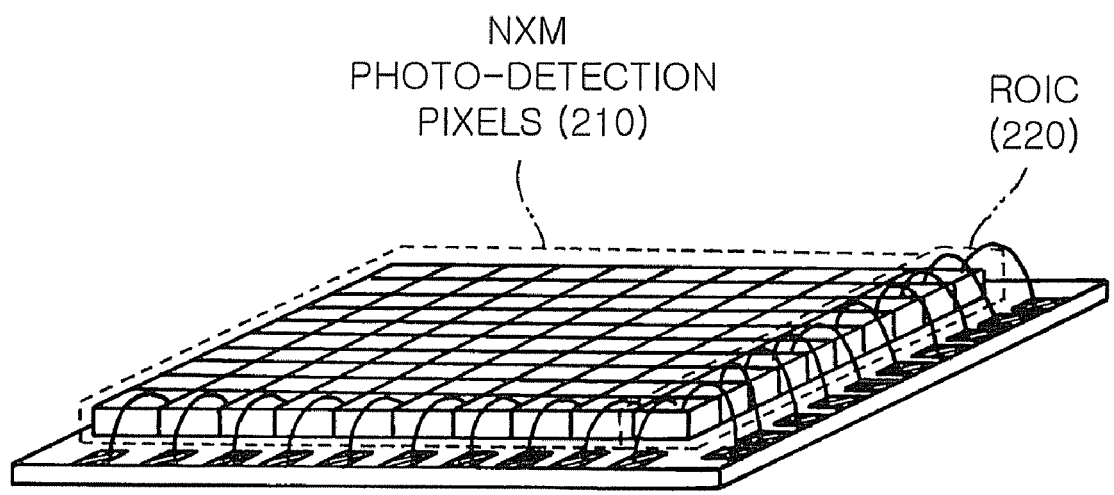
FIG. 3 is a view illustrating an example of the photo-detector array IC according to the embodiment of the present invention.

As shown in FIG. 3 in the photo-detector array IC according to the present invention, the n×m photo-detection pixels 210 and the ROTC 220 are simultaneously formed on the same substrate, that is, a semi-insulating InP substrate. Next, the photo-detection pixels 210 and the ROIC 220 are electrically isolated from each other by using a polyimide. Next, the photo-detection pixels 210 and the ROIC 220 are connected to each other by using metal interconnection lines.

As a result, a two-dimensional photo-detector array IC can be implemented as a planar monolithic structure, and a metal interconnection structure can also be very simplified.

Figure 4:
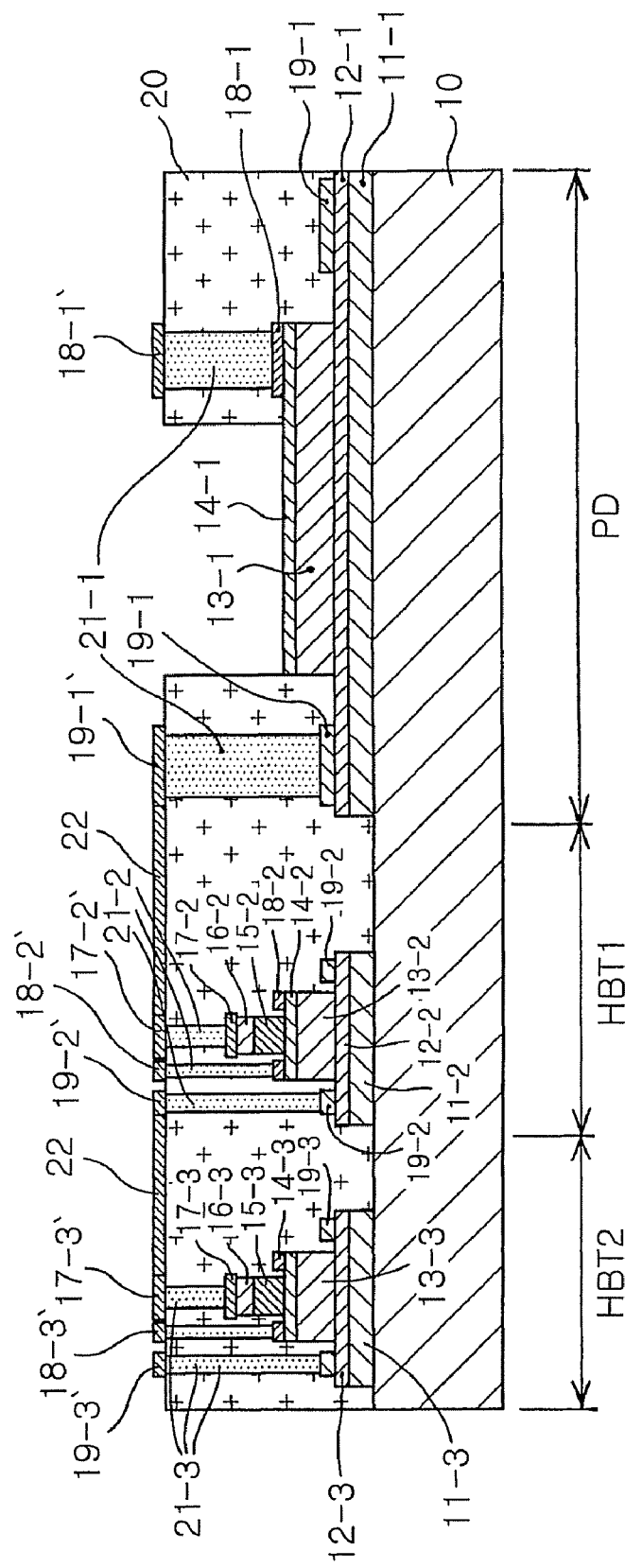
FIG. 4 is a cross-sectional view for explaining structures of photo-detection pixels and a ROIC according to the embodiment of the present invention.

FIG. 4 is a cross-sectional view for explaining structures of the photo-detection pixels and the ROIC according to the embodiment of the present invention.

Referring to FIG. 4, the photodiode PD of the photo-detection pixel 210 includes a buffer layer 11-1 formed on a semi-insulating InP substrate wafer 10, an n-type layer 12-1 formed on the buffer layer 11-1, a photo-absorption layer 13-1 formed on a central region of the n-type layer 12-1, a p-type layer 14-1 formed on the photo-absorption layer 13-1, a p-type electrode 18-1 formed on an edge region of the p-type layer 14-1, n-type electrodes 19-1 formed on both edge regions of the n-type layer 12-1, a polyimide 20 applied on the n-type layer 12-1, the p-type layer 14-1, the p-type electrode 18-1, the n-type electrodes 19-1 so as to remove height difference with the first and the second HBTs HBT1 and HBT2, vias 21-1 formed to penetrate the polyimide 20 applied on the p-type electrode 18-1 and the n-type electrodes 19-1, and p and n surface pads 18-1' and 19-1' formed on the vias 21-1.

The first HBT HBT1 includes a buffer layer 11-2 formed on the semi-insulating InP substrate wafer 10, a sub-collector 12-2 formed on the buffer layer 11-2, a collector 13-2 formed on a central region of the sub-collector 12-2, a base 14-2 formed on the collector 13-2, an emitter 15-2 formed on a central region of the base 14-2, an ohmic layer 16-2 formed on the emitter 15-2, an emitter electrode 17-2 formed on the ohmic layer 16-2, base electrodes 18-2 formed on both edge regions of the base 14-2, collector electrodes 19-2 formed on both edge regions of the sub-collector 12-2, the polyimide applied on the sub-collector 12-2, the base 14-2, the emitter electrode 17-2, the base electrode 18-2, and the collector electrode 19-2 so as to remove height difference with the photodiode PD, vias 21-2 formed to penetrate the polyimide 20 applied on the emitter electrode, the base electrode, and the collector electrode 17-2, 18-2, and 19-2, and emitter, base, and collector surface pads 17-2', 18-2', and 19-2' formed on the vias 21-2.

The second HBT HBT2 of the ROIC 220 includes a buffer layer 11-3 formed on the semi-insulating InP substrate wafer 10, a sub-collector 12-3 formed on the buffer layer 11-3, a collector 13-3 formed on a central region of the sub-collector 12-3, a base 14-3 formed on the collector 13-3, an emitter 15-3 formed on a central region of the base 14-3, an ohmic layer 16-3 formed on the emitter 15-3, an emitter electrode 17-3 formed on the ohmic layer 16-3, base electrodes 18-3 formed on both edge regions of the base 14-3, collector electrodes 19-3 formed on both edge regions of the sub-collector 12-3, the polyimide 20 applied on the sub-collector 12-3, the base 14-3, the emitter electrode 17-3, the base electrode 18-3, and the collector electrode 19-3 so as to remove height difference with the photodiode PD, vias 21-3 formed to penetrate the polyimide 20 applied on the emitter electrode, the base electrode, and the collector electrode 17-3, 18-3, and 19-3, and emitter, base, and collector surface pads 17-3', 18-3', and 19-3' formed on the vias 21-3.

In addition, metal interconnection lines 22 are further provided for electrical connection between the n surface pad 19-1' of the photodiode PD and the emitter surface pad 17-2' of the first HBT HBT1 and between the collector electrode 19-2' of the first HBT HBT1 and the emitter surface pad 17-3' of the second HBT HBT2.

FIGS. 5A to 5F is cross-sectional views for explaining a method of manufacturing the photo-detection pixels and the ROIC according to the embodiment of the present invention.

Figure 5A:
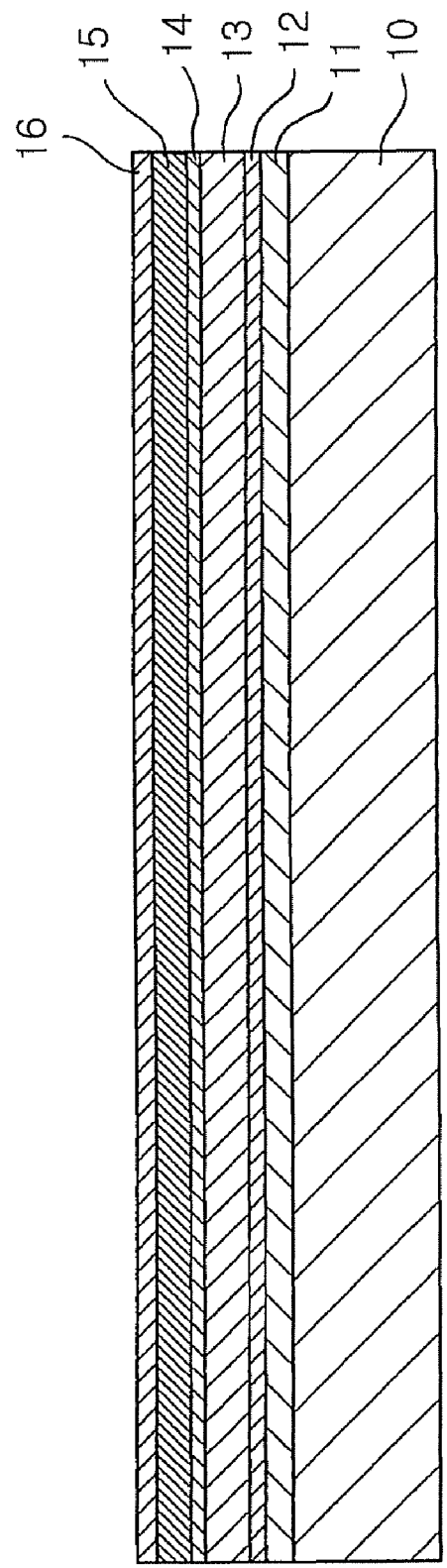
FIGS. 5A to 5F is cross-sectional views for explaining a method of manufacturing photo-detection pixels and a ROIC according to an embodiment of the present invention.

Firstly, as shown in FIG. 5A, crystal structures of n+-InP 11, n+-InGaAs 12, i-InGaAs 13, p+-InGaAs 14, n+-InP 15, and n+-InGaAs 16 are sequentially grown on the semi-insulating InP substrate wafer 10 by using a metal organic chemical vapor deposition (MOCVD) growth method.

Figure 5B:
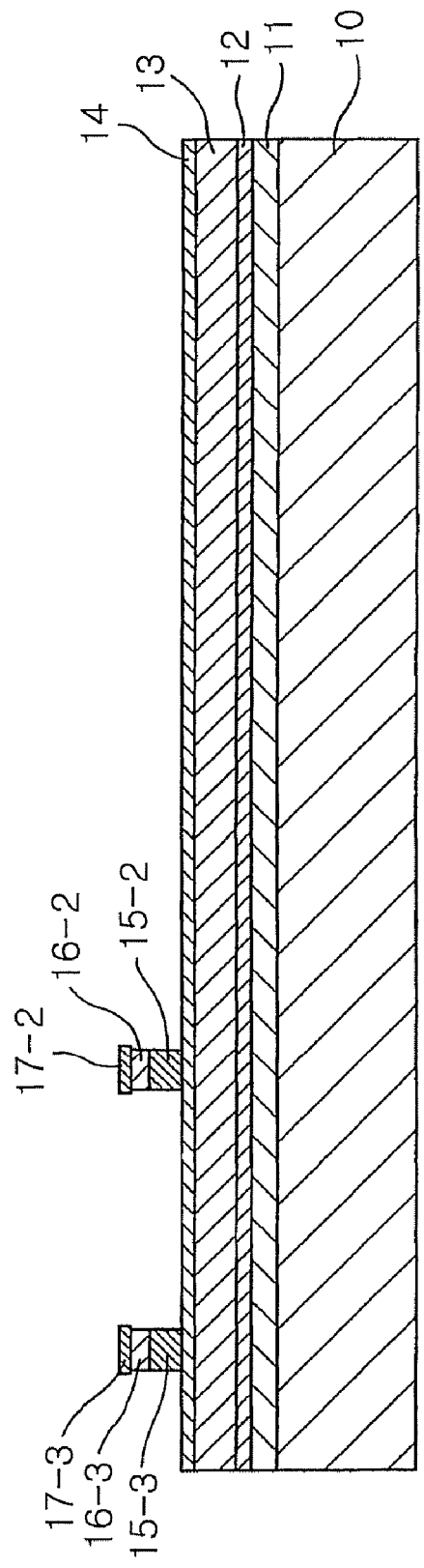

Next, as shown in FIG. 5B, in order to manufacture the first and second HBTs HBT1 and HBT2, Ti/Pt/Au is deposited on first and second HBT regions of n+-InGaAs 16 to form the emitter electrodes 17-2 and 17-3 of the first and second HBTs, HBT1 and HBT2, by using a photolithography and a lift-off process.

Next, the emitters 15-2 and 15-3 and the ohmic layers 16-2 and 16-3 of the first and second HBTs HBT1 and HBT2 are formed by partially etching the n+-InP 15 and the n+-InGaAs 16 where the emitter electrodes 17-2 and 17-3 are not formed.

Figure 5C:
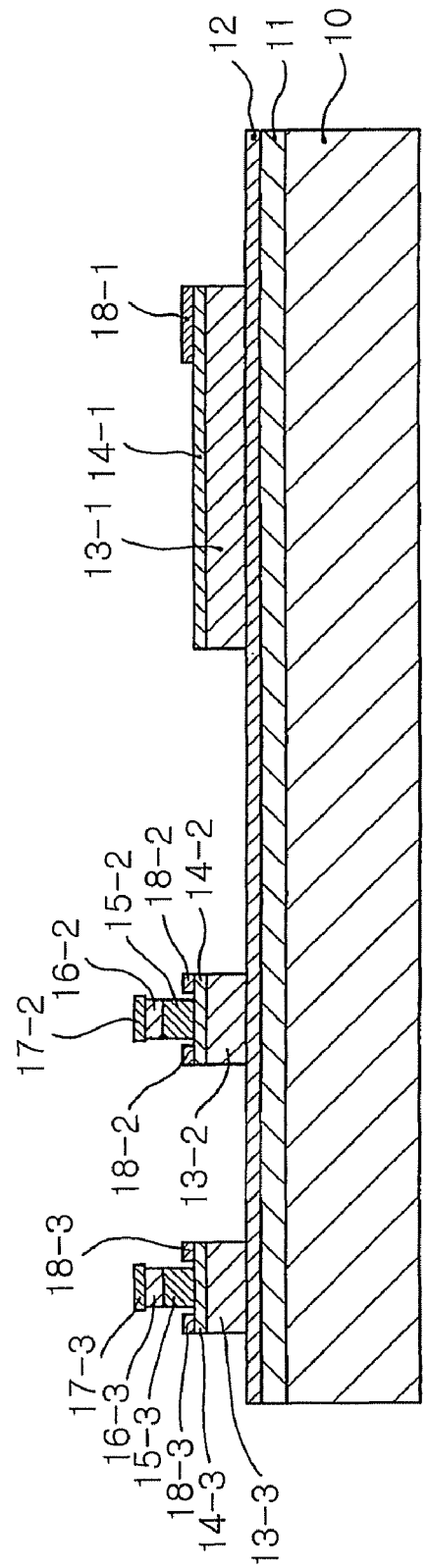

Next, as shown in FIG. 5C, the base electrodes 18-2 and 18-3 of the first and second HBTs HBT1 and HBT2 are formed to be separated by a predetermined distance from the emitters 15-2 and 15-3 by depositing Ti/Pt/Au on the p+-InGaAs 14, and at the same time, the p-type electrode 18-1 of the photodiode PD is formed by depositing Ti/Pt/Au on a photodiode region of the p+-InGaAs 14.

Next, the base layers 13-2 and 13-3 and the collector layers 14-2 and 14-3 of the first and second HBTs, HBT1 and HBT2, and the photo-absorption layer 13-1 and the p-type layer 14-1 of the photodiode PD are formed by partially etching the i-InGaAs 13 and the p+-InGaAs 14.

More specifically, the i-InGaAs 13 and the p+-InGaAs 14 are partially etched to leave the i-InGaAs 13 and the p+-InGaAs 14 deposited under the base electrodes 18-2 and 18-3 and the p-type electrode 18-1.

Figure 5D:
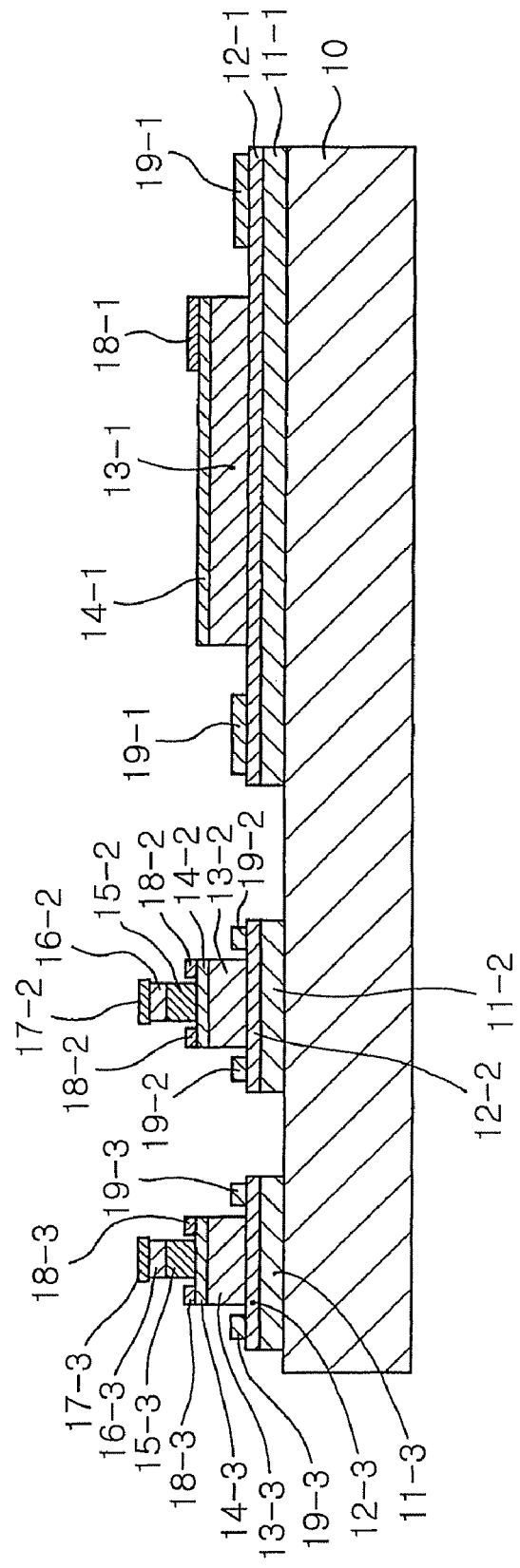

Next, as shown in FIG. 5D, the collector electrode pads 19-2 and 19-3 of the first and second HBTs, HBT1 and HBT2, and the n-type electrode 19-1 of the photodiode PD are formed to be separated by predetermined distances from the base layers 13-2 and 13-3 and the photo-absorption layer 13-1 by depositing Ti/Pt/Au on the n+-InGaAs 12.

Next, first HBT, second HBT, and photodiode formation regions are spatially separated from each other by partially etching the n+-InP 11 and the n+-InGaAs 12 through a reactive ion vapor etching method.

More specifically, the n+-InP 11 and the n+-InGaAs 12 are partially etched to leave the n+-InP 11 and the n+-InGaAs 12 deposited under the collector electrode pads 19-2 and 19-3 and the n-type electrode 19-1.

Figure 5E:
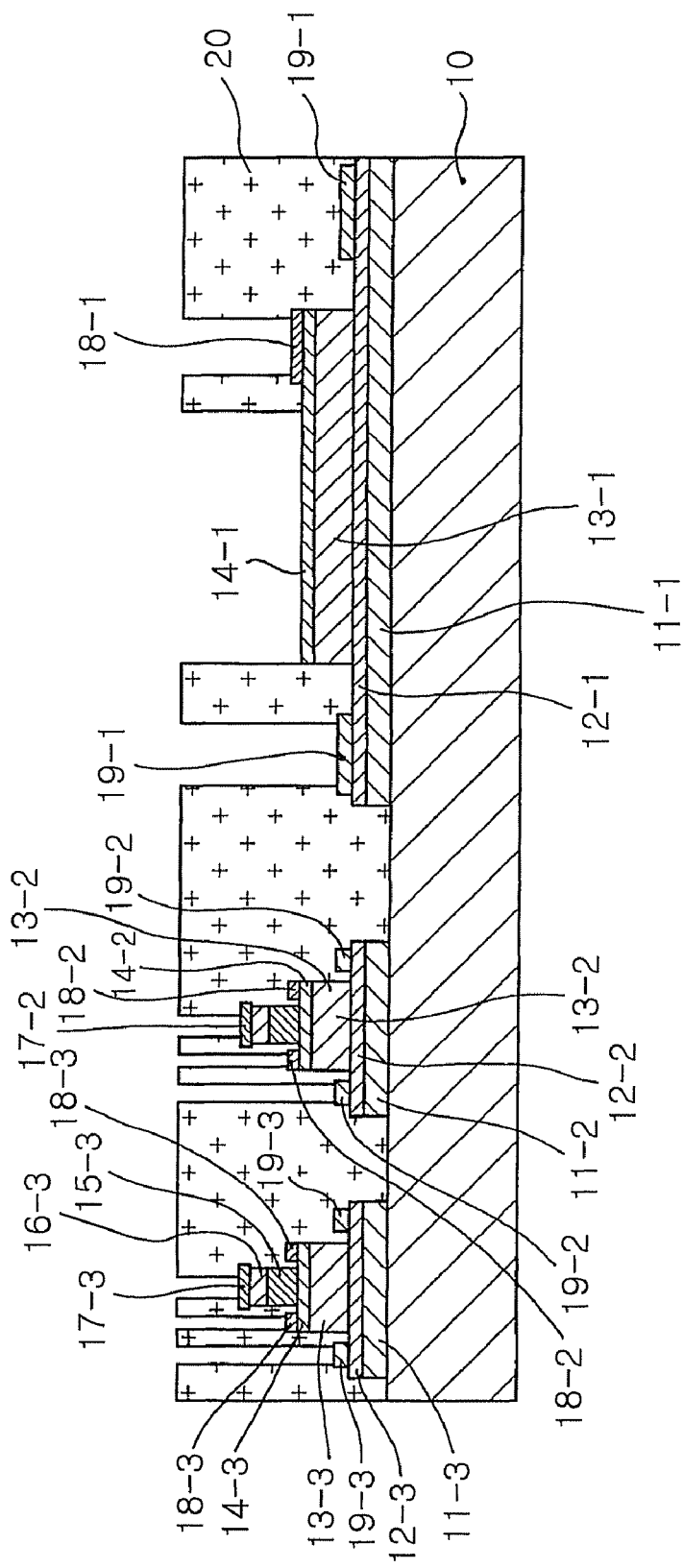

Next, as shown in FIG. 5E, the polyimide 20 is applied on the semi-insulating InP substrate wafer 10 so as to cover the first HBT, HBT1, the second HBT, HBT2, and the photodiode PD. Next, the vias are formed by etching the polyimide 20 applied on all the electrodes 17-2, 17-3, 18-1, 18-2, 18-3, 19-1, 19-2, and 19-3 of the first HBT HBT1, the second HBT HBT2, and the photodiode PD and a light-incident region of the photodiode PD through a lithography process and a dry etching process.

Figure 5F:
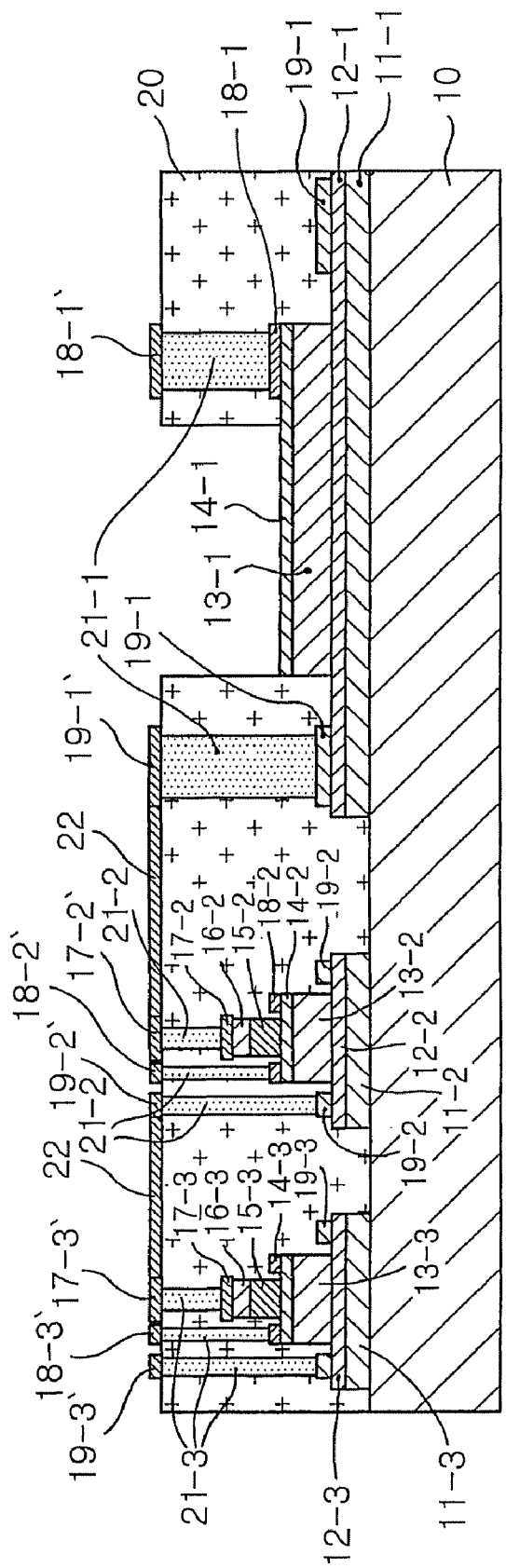

Next, as shown in FIG. 5F, the regions where the polyimide 20 is removed is electroplated with Au by using a Au-plating process. After the vias 21-1, 21-2, and 21-3 are formed, the surface pads 17-2', 18-2', 19-2', 17-3', 18-3', and 19-3' of the first and second HBTs HBT1 and HBT2 and the surface pads 18-1' and 19-1' of the photodiode PD are formed on the vias 21-1, 21-2, and 21-3.

Finally, the metal interconnection lines for electrical connection between the n surface pad 19-1' of the photodiode PD and the emitter surface pad 17-2' of the first HBT, HBT1 and between the collector electrode 19-2' of the first HBT, HBT1 and the emitter surface pad 17-3' of the second HBT HBT2 are formed on the polyimide 20.

According to the aforementioned embodiments of the present invention, since a photodiode and control devices for selecting and outputting a laser-radar image signal are simultaneously formed on an InP substrate, it is possible to simplify manufacturing processes and increasing yield.

In the aforementioned embodiments, after the surface pads for the first and second HBTs HBT1 and HBT2 and the photodiode PD corresponding to the electrodes underlying the polyimide 20 are formed, the surface pads are electrically connected to each other through the metal interconnection lines. However, according to the manufacturing processes and device characteristics, the electrodes of the first and second HBTs HBT1 and HBT2 and the photodiode PD are electrically connected to each other directly.

According to a photo-detector array device with ROIC monolithically integrated and a manufacturing method thereof according to the present invention, since a photodiode and control devices for selecting and outputting a laser-radar image signal are simultaneously formed on an InP substrate, additional flip chip hybrid packaging process is not needed, so that it is possible to simplify manufacturing processes and to greatly increasing yield.

In addition, after the photodiode and the control devices for selecting and outputting the laser-radar image signal are simultaneously formed on the InP substrate, the photodiode and the control devices are electrically speared from each other by using a polyimide. Therefore, a PN junction surface of the photodiode is buried, so that a surface leakage current can be reduced and an electrical reliability can be improved. In addition, a structure of the control devices can be simplified, so that image signal reception characteristics can be improved.

Therefore, it is possible to implement ultra large scale integration of a photo-detector array IC for a laser-radar image signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a photo-detector array device integrated with a read-out integrated circuit (ROIC) monolithically integrated for a laser-radar image signal, comprising:

forming on a semi-insulating InP substrate wafer a photodiode for converting incident light energy to electric energy, a first heterojunction bipolar transistor for selecting electric energy of the photodiode in a row of the photodiode array and a second heterojunction bipolar transistor for selecting the output of the electrical signals that are transmitted from the photo-detector in a column of the photodiode array;

applying polyimide on the semi-insulating InP substrate wafer to be covered the photodiode and the first and the second heterojection bipolar transistors;

forming surface pads on the polyimide, the surface pads being electrically connected to electrodes of the photodiode and the first and second heterojection bipolar transistors; and forming metal interconnection lines on the polyimide, the metal interconnection lines being provided for electrical connection between the surface pad of an n-type electrode of the photodiode and the surface pad of an emitter electrode of the first heterojunction bipolar transistor and between the surface pad of a collector electrode of the first heterojunction bipolar transistor and the surface pad of an emitter electrode of the second heterojunction bipolar transistor.

2. The method of claim 1, wherein the forming of the photodiode, the first heterojunction bipolar transistor, and the second heterojunction bipolar transistor comprises:

sequentially growing n+-InP, n+-InGaAs, i-InGaAs, p+-InGaAs, n+-InP, n+-InGaAs crystal structures on the semi-insulating InP substrate wafer;

forming the emitter electrodes of the first and second heterojection bipolar transistors on the n+-InGaAs;

forming emitters and ohmic layers of the first and second heterojection bipolar transistors by partial etching;

forming, on the p+-InGaAs, base electrodes of the first and second heterojunction bipolar transistors to be separated by a first predetermined distance from the emitters and forming a p-type electrode of the photodiode;

forming base layers and collector layers of the first and second heterojunction bipolar transistors and a photo-absorption layer and a P-type layer of the photodiode by partially etching the i-InGaAs and the p+-InGaAs;

making, on the n+-InGaAs, collector electrode pads for the first and second heterojunction bipolar transistors to be separated by a second predetermined distance from the base layers, and forming an n-type electrode of the photodiode to be separated by a third predetermined distance from the photo-absorption layer; and forming buffer layers and sub-collectors of the first and second heterojunction bipolar transistors and a buffer layer and an n-type layer of the photodiode by partially etching the n+-InP and the n+-InGaAs.

3. The method of claim 1, wherein the forming of the surface pads comprises:

forming vias penetrating the polyimide applied on all the electrodes of the first and second heterojunction bipolar transistors and the photodiode so as to form the surface pads for the first and second heterojunction bipolar transistors and the photodiode;

forming a surface-incident-type photodiode by etching and removing the polyimide applied to a light incident region of the photodiode; and forming the surface pads on the vias to be electrically connected to all the electrodes of the first and second heterojunction bipolar transistors and the photodiode.

4. The method of claim 1, wherein all the electrodes of the first and second heterojunction bipolar transistors and the photodiode are made of Ti/Pt/Au.

* * * * *